July 25, 1967 D. M. KENNEY 3,332,137

METHOD OF ISOLATING CHIPS OF A WAFER OF SEMICONDUCTOR MATERIAL

Filed Sept. 28, 1964 2 Sheets-Sheet 1

INVENTOR.
DONALD M. KENNEY
BY
W. S. Hill
AGENT

INVENTOR.
DONALD M. KENNEY
BY
W. S. Hill
AGENT

United States Patent Office
3,332,137
Patented July 25, 1967

3,332,137
METHOD OF ISOLATING CHIPS OF A WAFER OF SEMICONDUCTOR MATERIAL

Donald M. Kenney, Somerville, N.J., assignor to Radio Corporation of America, a corporation of Delaware
Filed Sept. 28, 1964, Ser. No. 399,476
9 Claims. (Cl. 29—423)

This invention relates generally to an improved method of forming physically and electrically isolated chips of semiconductor material having an undisturbed surface suitable for having active or passive devices formed therein. The method may be utilized to produce an array of chips of semiconductor material arranged in a predetermined pattern, each chip being electrically insulated from the other. The improved method of the present invention is particularly useful in the manufacture of electronic integrated circuits.

In the manufacture of electronic integrated circuits, it has been proposed to electrically isolate zones, or chips, of a wafer of semiconductor material from each other by the method of forming a plurality of mesas protruding from a substrate portion of the wafer, surrounding the mesas with an insulating material, and lapping the substrate portions of the wafer to a depth sufficient to isolate the mesas from each other. Such D–C isolation of the chips prevents or markedly reduces parasitic currents and capacitances between components on different chips. This prior art method of isolating chips of a wafer of semiconductor material is satisfactory for certain applications. However, the lapping operation which removes the substrate is difficult to control so that exactly the right thickness of material is removed. Moreover, the lapped surface has its crystallographic structure disturbed. Subsequent etching of the lapped surface can improve the condition but often results in surface pitting. Also, if one or more epitaxial layers are present in the semiconductor wafer, it is usually desired to maintain the thicknesses of these layers intact on the isolated chips.

In the subsequent formation of transistors in these chips, for example, the thickness of the epitaxial layer that comprises the collector portions of the transistors should be precisely controlled to obtain the optimum performance of the transistors. Such precise control, however, is difficult, if not impossible, with the aforementioned prior art method because the thickness of the epitaxial layer is microscopic in dimension, and it is difficult to control the aforementioned lapping operation to obtain a desired thickness of the epitaxial layer.

It is an object of the present invention to provide an improved method of forming electrically isolated chips of semiconductor material wherein the chips have one of their major surfaces in a condition particularly suitable for electronic devices or integrated circuits.

Another object of the present invention is to provide an improved method of electrically isolating a plurality of chips of a wafer of semiconductor material from each other without affecting the thickness of one or more layers of material deposited on, or in, the wafer.

Still another object of the present invention is to provide an improved method of physically and electrically isolating chips of a wafer of semiconductor material from each other without unduly pitting the surfaces of the chips in which active and passive electronic components are to be formed.

A further object of the present invention is to provide an improved method of physically and electrically isolating chips of a wafer of semiconductor material from each other in a predetermined pattern for efficient use in an electronic integrated circuit.

The improved method of electrically isolating chips of a circuit wafer of semiconductor material, in accordance with the present invention, is carried out with the aid of a handle wafer. Briefly stated, the improved method comprises forming a plurality of mesas on one major surface of the circuit wafer. The tops of the mesas are preferably covered with a layer of bonding material such as an oxide of the semiconductor. The grooves between the mesas should extend to a depth below any layers deposited on, or diffused in, the aforementioned major surface of the circuit wafer. The handle wafer is bonded to the plateau surfaces of the mesas, and the opposite major surface of the circuit wafer is lapped to a depth that communicates with the aforementioned grooves, whereby to physically separate the mesas from each other. While the separated mesas, now called chips, are still attached to the handle wafer, electrical insulating material is deposited over and between the chips. The handle wafer is now removed, as by etching, and the chips of semiconductor material remain physically and electrically isolated from each other by the aforementioned deposited insulating material. In one embodiment of the present invention, where the original semiconductor wafer is monocrystalline silicon, the deposited insulating material is polycrystalline silicon. In other embodiments of the invention, the deposited insulating materials are silicon dioxide and glass.

The novel features of the present invention, both as to its organization and operation, as well as additional objects and advantages thereof, will be more readily understood from the following description, when read in connection with the accompanying drawings in which similar reference characters refer to similar parts throughout, and in which.

Figure 4:
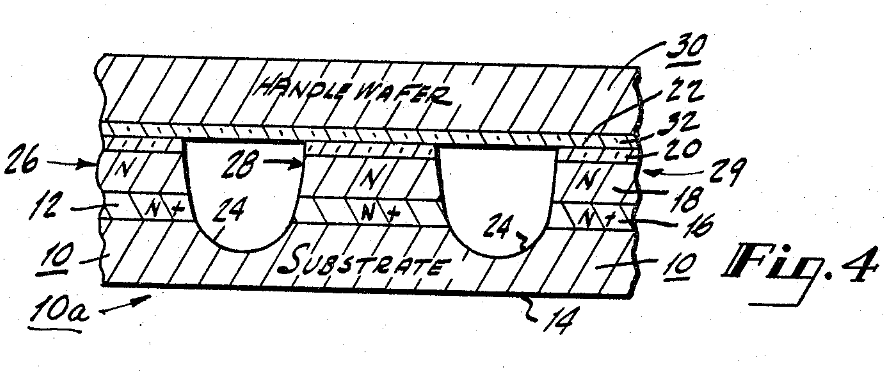
Figure 5:
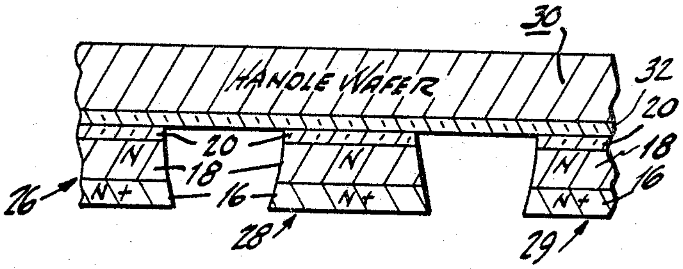
Figure 6:
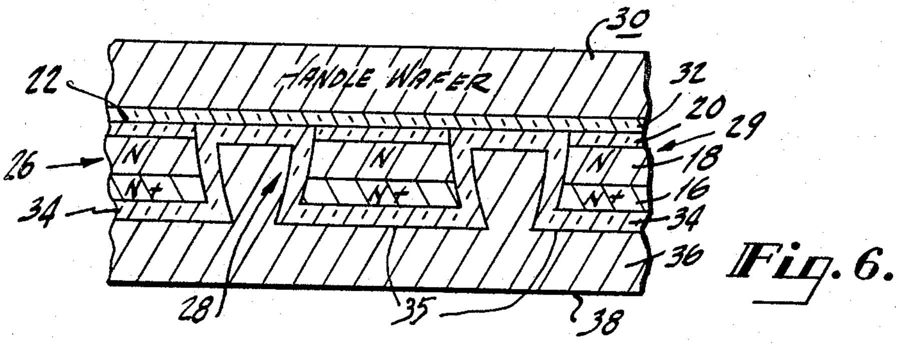
Figure 7:
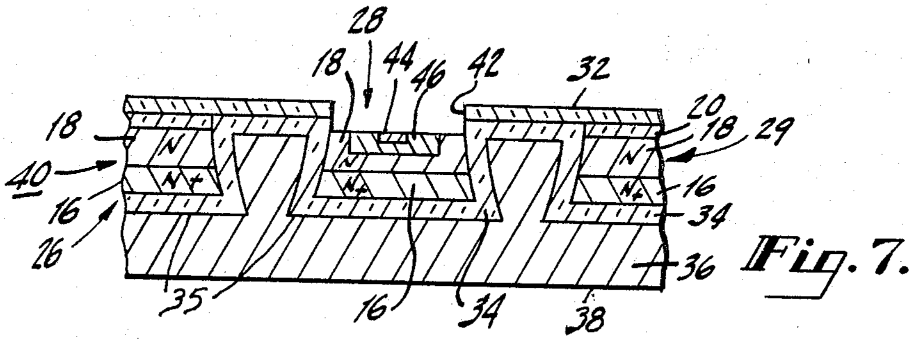

FIGS. 4, 5 and 6 are fragmentary, cross-sectional views of the circuit wafer and a handle wafer attached thereto in successive steps in the isolation of chips of the circuit wafer in the method of the present invention; and FIG. 7 is a cross-sectional view of the electrically isolated chips of the circuit wafer, in accordance with the method of the present invention, and illustrating the formation of part of an electronic components in one of the chips.

Figure 1:
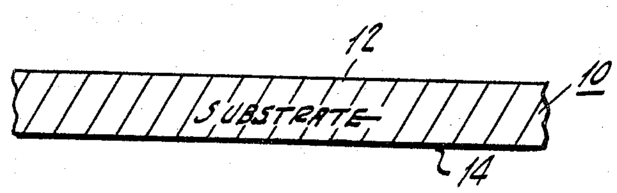
FIG. 1 is a fragmentary, cross-sectional view of a circuit wafer of semiconductor material from which isolated chips are to be formed in accordance with the method of the present invention.

Referring now, particularly to FIG. 1 of the drawings, there is shown a portion of a circuit wafer 10 of semiconductor material, such as silicon or germanium, for example, having two opposed major surfaces 12 and 14. In a preferred embodiment of the method of the present invention, the circuit wafer 10 is of silicon, having a thickness of about 10 mils and an area of about one square inch. The dimensions and shape of the wafer 10 are not critical, and it may comprise N-type or P-type semiconductor material. The wafer 10, as shown in FIG. 1, may serve as a substrate for layers of material to be deposited on, or diffused in, at least one of its major surfaces.

Prior to electrically isolating chips of the wafer 10, in accordance with the method of the present invention, one or more layers of semiconductor material and/or oxide may be deposited on, or formed in, one of the major surfaces of the wafer 10 to provide portions of devices to be formed in the subsequent chips of the wafer 10. Thus, referring to FIG. 2 of the drawing, three layers are shown superimposed on the major surface 12 of the wafer 10. A layer 16 of N-type semiconductor material, for example, designated by the symbol N+, is deposited on the major surface 12 of the wafer 10. The thickness of the layer 16 may be in the order of 5 microns and may have a resistivity of about 0.01 ohm-cm., for example. A layer 18 of N-type material, designated by the symbol N, is deposited on the layer 16. The thickness of the layer 18 may be in the order of 8 microns and may have a resistivity of about 0.3 ohm-cm., for example. The layers 16 and 18 may be epitaxial depositions of doped silicon or germanium applied by the method of vapor deposition described in the article, "Epitaxial Deposition of Silicon and Germanium Layers by Chloride Reduction," by E. F. Cave and B. R. Czorny, in the RCA Review, vol. XXIV, December 1963.

An oxide layer 20 is deposited or formed on the layer 18 by any suitable means known in the art. For example, where the layer 18 is silicon, a silicon-dioxide layer 20 may be formed by heating the wafer 10 in steam at a temperature of about 1225° C. until a silicon-dioxide layer 20 of about 10,000 A. is formed. The number, the dimensions, and the characteristics of the layers, such as the layers 16, 18, and 20, on, or in, the wafer 10 are not critical. Any desired combination of either epitaxial or diffused layers may be used, as needed, in accordance with the method of the present invention.

Figure 2:
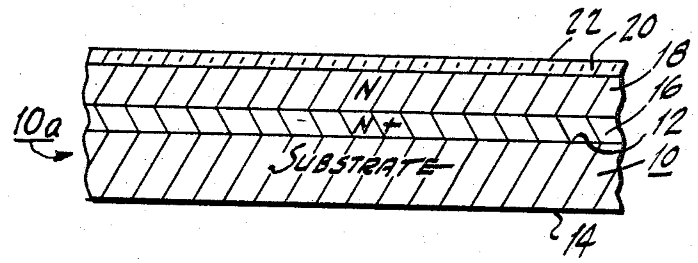
FIG. 2 is a fragmentary, cross-sectional view of the circuit wafer of semiconductor material illustrated in FIG. 1, showing epitaxial layers on one major surface of the circuit wafer in accordance with the method of the present invention.

The term "circuit wafer," as used herein, applies to both the wafer 10, shown merely as a substrate, as in FIG. 1 and to the composite wafer **10*a*, including the layers 16, 18, and 20 also, as shown in FIG. 2. The circuit wafer 10*a* in FIG. 2, having two opposed major surfaces 14 and 22**, will be used to illustrate the novel method of forming isolated chips in accordance with the present invention.

To provide a structure of electrically isolated chips of the circuit wafer **10*a*, a plurality of mesas is initially formed on one side of the circuit wafer 10. To this end, a plurality of grooves 24 is formed in the major surface 22 of the circuit wafer 10*a*, each groove 24 extending to substantially the same depth. Each of the grooves 24 should extend through the layers 20, 18, and 16, terminating in the substrate of the circuit wafer 10*a*. The grooves 24** may be formed by photolithographic and chemical etching techniques, as, for example, described in U.S. Patent No. 3,122,817, for Fabrication of Semiconductor Devices, issued to J. Andrus, on Mar. 3, 1964.

Figure 3:
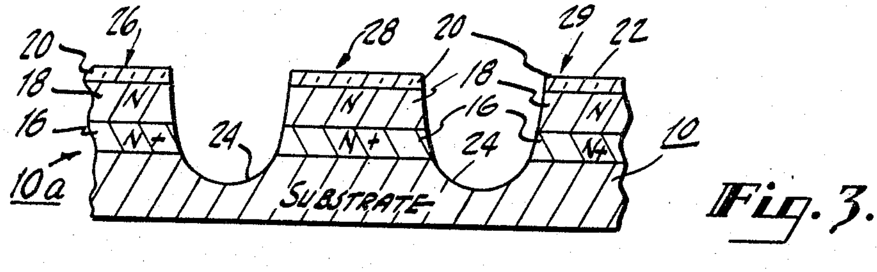
FIG. 3 is a fragmentary, cross-sectional view of the circuit wafer shown in FIG. 2, illustrating the formation of mesas in an operation of the method of the present invention.

In the circuit wafer **10*a*, illustrated in FIG. 3, the depth of each groove 24, measured from the major surface 22, may be in the order of 1 mil. The grooves 24 may also be formed by sawing or by any other suitable means known in the art. In FIG. 3, mesas 26, 28, and 29 are shown formed by two grooves 24. It is also preferable for grooves (not shown) to be formed transversely to the grooves 24 in the major surface 22** to provide mesas of desired size. The mesas thus formed will provide, when separated, the desired isolated chips.

Means are provided to maintain the mesas 26, 28, and 29 in a desired pattern, determined by the grooves 24, during the process of isolating them physically and electrically. To this end, a handle wafer 30, preferably of the same material as the circuit wafer **10*a*, is bonded to the circuit wafer 10*a*, as shown in FIG. 4. To accomplish this bonding, the handle wafer 30 is formed with an oxide layer 32 of silicon dioxide on one of its major surfaces. The handle wafer 30 is disposed against the circuit wafer 10*a* with their respective oxide layers 32 and 20 in contact with each other. The handle wafer 30 is bonded to the circuit wafer 10*a* by heating the wafers to a temperature of about 1225° C. and pressing them together with a pressure of about 2000 p.s.i. for about one minute. The handle wafer 30 may also be bonded to the circuit wafer 10** by a glass bond, as by using a borosilicate, lead silicate, or phosphosilicate glass as a bonding agent.

Mesas 26, 28, and 29 may now be isolated from each other by removing all, or most, of the original substrate

10 of the circuit wafer **10*a*. This may be accomplished by lapping or grinding the major surface 14 of the circuit wafer 10*a* to a depth beyond the bottom of the grooves 24, as shown in FIG. 5. It is not necessary to polish or lap off all of the substrate of the circuit wafer 10*a* to separate the mesas. The amount of substrate removed by this operation depends upon the depth of the grooves 24 and should be sufficient to separate the mesas a desired distance from each other for electrical isolation. Since the plateau surface, that is, the oxide layer 20, on each mesa, is bonded to the handle wafer 30, the mesas 26, 28, and 29 are maintained in the same array in which they were disposed initially on the circuit wafer 10*a***.

The exposed portions of the mesas are now preferably covered with a layer of binding and insulating material, such as a layer 34 of silicon dioxide, to a depth of about 10,000 A., as shown in FIG. 6. The silicon dioxide layer 34 may be deposited from a vapor phase by exposing the mesas to the reaction product of silicon tetrachloride and water vapor at a temperature of about 1100° C. The silicon dioxide layer 34 may also be formed around the mesas by heating the latter in steam at a temperature of about 1050° C. for about 30 minutes.

After the silicon dioxide layer 34 has been formed, as shown in FIG. 6, the spaces between the mesas, and preferably the space over the mesas also, are filled in with electrical insulating material 36 having binding characteristics. In one embodiment of the present invention, the insulating material is polycrystalline silicon. This polycrystalline silicon may be deposited epitaxially by the method described in the aforementioned article in the RCA Review. In this deposition $SiH_4$ is heated to about 1100° C., and silicon is produced according to the following reaction:

$$SiH_4 \xrightarrow{1100^\circ\ C.} Si + 2H_2$$

The silicon may also be deposited on the layer 34 by the reduction of $SiCl_4$ in accordance with the following reaction:

$$SiCl_4 + 2H_2 \xrightarrow{1120\text{–}1350^\circ\ C.} Si + 4HCl$$

as described in the aforementioned article. The polycrystalline silicon is deposited preferably to a depth of about 5 mils below the lowest surface 35 of the mesas 26, 28, and 29. The bottom surface 38 of the insulating layer 36 of polycrystalline silicon may now be lapped, as desired, to form a planar surface, as shown in FIG. 6.

In another embodiment of the method of electrically isolating the mesas 26, 28, and 29 with an insulating, binding material, silicon dioxide may be deposited, or between and over, the mesas by vapor deposition in accordance with the following reaction:

$$\underset{\text{vapor}}{SiCl_4} + \underset{\text{vapor}}{2H_2O} \xrightarrow{1100^\circ\ C.} SiO + 4HCl$$

The silicon dioxide, forming the insulating layer 36, is deposited preferably to a depth of about 5 mils below the lower surface 35 of the mesas and lapped to provide the smooth planar surface 38, as shown in FIG. 6.

In still another embodiment of the present invention, the insulating material 36 is glass. The glass may be inserted between, or between and over the mesas 26, 28, and 29 by softening the glass with heat and pressing the softened glass into place. For example, a wafer of glass may be deposited beneath the lower surface 35 of the mesas 26, 28, and 29, and pressure may be applied between the glass and the handle wafer 30 while the glass is heated, as in as induction furnace, to its softening temperature, whereby softened glass is disposed between and over the mesas. The glass, when cooled, may be lapped and polished, as desired.

After the insulating material 36 has cooled and hardened, the handle wafer 30 is removed. This can be accomplished by etching the handle wafer with anhydrous HCl gas at a temperature between 800° C. and 1200° C., depending upon the material of the handle wafer. Where the handle wafer is silicon, the etching temperature is about 950° C. A temperature of about 850° C. is used to etch germanium. Since a layer of silicon dioxide has been provided between the handle wafer 30 and the epitaxial layers 18 of each chip, it is relatively easy eto remove the handle wafer while leaving the oxide layer intact.

Referring, now, particularly to FIG. 7, there is shown a composite wafer 40 comprising mesas 26, 28, and 29 physically and electrically isolated from each other by the insualting material 36 adhered to them, the handle wafer 30 having having been removed. Openings, such as the opening 42, for example, in the oxide layers 32 and 20, may now be formed by photolithographic and chemical etching techniques known in the art for the purpose of producing an active or a passive electronic component in the mesa 28. Thus, N-type and p-type layers 44 and 46 may be diffused into the N-type layer 18 by any suitable transistor fabrication technique. Such techniques are described, for example, in "Transistor Technology," vol. III, edited by J. F. Biondi, D. Van Nostrand, Inc., 1958, particularly chapters 3, 4, and 5.

An important feature in the improved method of isolating chips of a wafer of semiconductor material of the present invention is the fact that the thickness dimensions of the diffused or epitaxial layers, such as the layers 16, 18, and 20, for example, on one major surface of the initial circuit wafer 10*a* are preserved intact. Referring to all of the figures in the drawings, it is seen that the thickness of the layer 18, for example, remains substantially unchanged during the operations of the method of the present invention. The relatively lower resistivity of the N+ layer 16 provides a buried layer usually referred to as a "floating collector." Also, the surface of the layer 18 is protected from pitting or other disturbances by the oxide layer 20 during the method of the present invention.

From the foregoing description, it will be apparent that there has been provided an improved method of isolating chips of a circuit wafer of semiconductor material without disturbing or without changing the thickness or surface of one or more layers that were formed in, or deposited on, a major surface of the original circuit wafer substrate. While only a few embodiments of the method have been described, variations in the operations of the method, all coming within the spirit of the invention, will no doubt, readily suggest themselves to those skilled in the art. Hence, it is desired that the foregoing description shall be considered as illustrative and not in a limiting sense.

What is claimed is:

1. A method of forming a body of electrically isolated chips from a wafer of semiconductor material having portions of one major surface thereof that are to be protected during the formation of said body, said method comprising the steps of:

forming a plurality of mesas in said wafer, said portions of said one major surface comprising the top surfaces of said mesas, bonding a handle wafer to said one major surface across said top surfaces of said mesas, whereby to protect said top surfaces, removing a portion of said wafer of semiconductor material, including the other major surface thereof, in an amount to separate said mesas from each other, whereby to form said chips, filling the spaces formed by said separation by depositing binding electrically insulating material between said chips, and removing said handle wafer from said one major surface so that said chips remain bound to, and insulated from, each other by said insulating material, thereby forming said body, said top surfaces comprising accessible portions of the surface of said body, whereby subsequent operations may be performed easily on said top surfaces.

2. A method of electrically isolating chips of a wafer of semiconductor material as defined in claim 1, wherein said insulating material is polycrystalline silicon.

3. A method of electrically isolating chips of a wafer of semiconductor material as defined in claim 1, wherein said insulating material is silicon dioxide.

4. A method of electrically isolating chips of a wafer of semiconductor material as defined in claim 1, wherein said insulating material is glass.

5. A method of forming a body of electrically isolated chips from a first wafer of semiconductor material with the aid of a handle wafer, said first wafer including a layer of material having a surface that is one major surface of said first wafer, and said one major surface having portions that are to be protected during the formation of said body, said method comprising the steps of:

forming, through said one major surface, a plurality of mesas in one portion of said first wafer, each of said mesas including a portion of said layer and having a top surface that includes a separate one of said portions to be protected, bonding said handle wafer to said one major surface, removing another portion of said first wafer, including the other major surface thereof, to a depth sufficient to separate said mesas from each other, whereby to form said chips, filling the spaces formed by said separation by depositing binding electrically insulating material between said chips, and removing said handle wafer from said one major surface so that said chips remain bound to, and insulated from, each other by said insulating material, thereby forming said body, each of said chips including a separate one of said portions to be protected, said last-mentioned portions comprising accessible portions on the surface of said body, whereby subsequent operations may be performed easily on said protected portions.

6. A method as defined in claim 5, wherein said insulating material is one chosen from the group consisting of polycrystalline silicon, silicon dioxide, and glass.

7. A method of forming a body of electrically isolated chips from a circuit wafer of semiconductor material with the aid of a handle wafer, said method comprising the steps of:

forming a first layer of protective material on one major surface of said circuit wafer, whereby to protect portions of said one major surface, forming a plurality of grooves through said one major surface, each of said grooves extending through said first layer and into said circuit wafer to a predetermined depth therein, whereby to form a plurality of mesas, bonding said handle wafer to said first layer of protective material, removing a portion of said circuit wafer, including the other major surface thereof, to a depth beyond the bottom of said grooves, whereby to separate said mesas physically from each other and to form said chips, depositing a second layer of insulating material around the exposed portions of said chips, filling the spaces formed by said separation by depositing binding electrically insulating material on said second layer, and removing said handle wafer from said first layer, whereby to form said body, each of said chips having a separate accessible one of said protected portions on the surface of said body.

8. A method as defined in claim 7, wherein said first layer of protective material is silicon dioxide and wherein said electrical insulating material on said second layer is one chosen from the group consisting of polycrystalline silicon, silicon dioxide, and glass.

9. A method of forming a body of electrically isolated chips from a first wafer of semiconductor material having layers of material of different conductivity thereon, said method comprising the steps of:

providing said first wafer of semiconductor material comprising a substrate and a plurality of layers of different material thereon, said first wafer having two major surfaces, forming a plurality of mesas in said first wafer, each of said mesas including a portion of each of said layers and one of said major surfaces of said first wafer, bonding a second wafer of semiconductor material, to serve as a protective handle wafer, across the top surfaces of said mesas, removing a portion of said first wafer, including the other major surface thereof, to a depth sufficient to separate said mesas from each other, but leaving said layers of different material intact, whereby to form said chips, filling the spaces formed by said separation by depositing binding electrically insulating material between said chips, and removing said second wafer from said top surfaces of said mesas, whereby to form said body, each of said chips having a separate one of said top surfaces on the surface of said body.

References Cited

UNITED STATES PATENTS

| | | | |
|---|---|---|---|
| 3,152,939 | 10/1964 | Borneman. | |
| 3,290,753 | 12/1966 | Chang | 29—25.3 |

OTHER REFERENCES

IBM Tech. Disc. Bull., vol. 1, No. 2, August 1958, page 25.

IBM Tech. Disc. Bull., vol. 3, No. 12, May 1961, pages 26, 27.

Electronics Review, vol. 37, No. 17, June 1, 1964, page 23.

WILLIAM I. BROOKS, *Primary Examiner.*